(12) United States Patent
Muramatsu

(10) Patent No.: US 6,191,838 B1
(45) Date of Patent: Feb. 20, 2001

(54) CIRCUIT BOARD CONNECTING STRUCTURE, ELECTRO-OPTICAL DEVICE, ELECTRONIC APPARATUS PROVIDED WITH THE SAME, AND MANUFACTURING METHOD FOR ELECTRO-OPTICAL DEVICE

(75) Inventor: Eiji Muramatsu, Toyoshina-machi (JP)

(73) Assignee: Seiko Epson Corporation (JP)

( * ) Notice: Under 35 U.S.C. 154(b), the term of this patent shall be extended for 0 days.

(21) Appl. No.: 09/375,993

(22) Filed: Aug. 17, 1999

(30) Foreign Application Priority Data

Aug. 18, 1998 (JP) .................................................. 10-232129
Jun. 30, 1999 (JP) .................................................. 11-185582

(51) Int. Cl.[7] ........................ G02F 1/1345; G02F 1/1333
(52) U.S. Cl. ............................ 349/149; 349/150; 349/58; 349/62
(58) Field of Search ..................................... 349/149, 150, 349/151, 152, 58, 60, 62; 361/681, 682

(56) References Cited

U.S. PATENT DOCUMENTS

| | | | |
|---|---|---|---|
| 5,164,853 | * 11/1992 | Shimazaki | 359/82 |
| 5,510,918 | * 4/1996 | Matsunaga et al. | 359/88 |
| 5,675,397 | * 10/1997 | Fukushima | 349/149 |
| 5,768,105 | * 6/1998 | Aota et al. | 361/777 |
| 5,897,188 | * 4/1999 | Sasuga et al. | 349/150 |
| 5,936,850 | * 8/1999 | Takahashi et al. | 361/784 |
| 5,946,062 | * 8/1999 | Hasegawa et al. | 349/58 |
| 5,990,989 | * 11/1999 | Ozawa | 349/61 |

\* cited by examiner

Primary Examiner—Kenneth Parker
Assistant Examiner—Mike Qi
(74) Attorney, Agent, or Firm—Harness, Dickey & Pierce, P.L.C.

(57) ABSTRACT

The present invention provides a circuit board connecting structure capable of connecting a circuit board, such as a flexible wiring board, and another circuit board by securing adequate contact pressure without the need for forming any special part thereby improving the reliability of contact and reducing the number of parts; an electro-optical device; electronic apparatus provided with the same; and a manufacturing method for an electro-optical device. The circuit board connecting structure electrically connects a conductive terminal 22-1 provided on a flexible wiring substrate 20, which is a first circuit board, and a conductive terminal 12 provided on a second circuit board 10. The connecting structure has a conductive member 30 provided between the first circuit board 20 and the second circuit board 10 to electrically connect the foregoing respective conductive terminals 22-1 and 12, a structural member 40 which is fixed to the first circuit board 20 and disposed to face one surface of the first circuit board 20, and a spacing member 60 provided between the structural member 40 and the first circuit board 20. The structural member 40 has a light guide 44 on which a liquid crystal display panel 50 is rested.

33 Claims, 14 Drawing Sheets

CIRCUIT BOARD CONNECTING STRUCTURE, ELECTRO-OPTICAL DEVICE, ELECTRONIC APPARATUS PROVIDED WITH THE SAME, AND MANUFACTURING METHOD FOR ELECTRO-OPTICAL DEVICE

BACKGROUND OF THE INVENTION

1. Industrial Field of the Invention

The present invention relates to a connecting structure of a circuit board, an electro-optical device, electronic apparatus provided with the same, and a manufacturing method for an electro-optical device.

2. Description of the Related Art

An electro-optical device such as a liquid crystal display device employs an integrated circuit (IC) device, on which driving IC components are mounted, to connect its driving circuit to a liquid crystal display (LCD) panel. Typical IC devices used for this purpose include a chip-on-film (COF) type wherein a flexible wiring board using a so-called "tape automated bonding (TAB) package (also known as a tape carrier package (TCP)" is connected to an LCD panel, and a chip-on-glass (COG) type wherein driving IC components are directly connected to a glass substrate. For instance, the wiring board employing the TCP is advantageous in that it is smaller and thinner than other types of packages, which makes it suited for high-density packaging, and the board is flexible to permit itself to be bent for packaging. These advantages allow the wiring board to find applications in a variety of types of electronic apparatus, including electro-optical devices.

Diverse types of terminals for connection to driving ICs are formed on wiring board employing the TCPs (herein after referred to as "TCP boards"). Hence, to configure electronic apparatus or the like, the terminals of a TCP board are electrically connected to the terminals of another circuit board.

In general, the packaging mode as set forth below is used to connect the terminals of the TCP board and the terminals of another circuit board. With a conductive member such as an anisotropic rubber connector provided between the terminals of the TCP board and the terminals of another circuit board, the TCP board and another circuit board are pressed in a connecting direction thereby to press the terminals of the TCP board and the terminals of another circuit board into contact via the conductive member. This accomplishes electrical connection between the terminals of the TCP board and the terminals of another circuit board.

The connecting structure set forth above, however, has been posing a problem since a flexible wiring board such as the TCP board and another circuit board are pushed against each other to bring them into contact so as to enable the electrical connection. More specifically, in a structure or an environment wherein an adequate force for bringing the flexible wiring board and another circuit board into close contact with each other cannot be secured, if the boards are subjected to external forces, especially vibrations or shocks, electrical connection may not be successfully accomplished, resulting in a continuity failure.

Furthermore, if a rubber connector formed of anisotropic conductive rubber is used for connecting a terminal on an electro-optical device, for example, an LCD panel, to a terminal of a flexible wiring board, then a failure of electrical connection may occur if vibrations, shocks, or other types of external forces are applied.

In addition, a dedicated press-in-contact member such as a case must be used to secure a sufficient contact pressure between a terminal of the flexible wiring board and a terminal of another board, adding to the number of components. Furthermore, to use such a press-in-contact member, the flexible wiring board and another circuit board must be compression-bonded by using a pressing jig. Hence, at locations where direct contact pressure cannot be secured, it is impossible to improve the reliability of contact, leading to a continuity failure.

Accordingly, an object of the present invention is to provide: a circuit board connecting structure which enables contact pressure to be secured without the need for employing a special press-in-contact member so as to achieve higher contact reliability in connecting a circuit board such as a flexible wiring board and another circuit board, which can be configured with less components; an electro-optical device; electronic apparatus provided with the same; and a manufacturing method for an electro-optical device.

SUMMARY OF THE INVENTION

To this end, according to one aspect of the present invention, there is provided a circuit board connecting structure for electrically connecting a conductive terminal provided on a first circuit board and a conductive terminal provided on a second circuit board, including:

a conductive member which is disposed between the first circuit board and the second circuit board that oppose each other, and electrically connects the respective conductive terminals;

a structural member disposed on an opposite side from a side where the second circuit board is disposed, in relation to the first circuit board; and a spacing member disposed between the structural member and the first circuit board.

With this arrangement, the respective conductive terminals are electrically connected by the conductive member installed between the first and second circuit boards. In bringing the conductive member and the respective conductive terminals into contact, the spacing member provided between the structural member and the first circuit board, and the structural member permit adequate contact pressure between the respective conductive terminals and the conductive member.

Thus, the reliable contact with the conductive member achieved by the contact pressure set forth above improves the reliability of the contact between the conductive member and the respective conductive terminals. This ensures successful electrical connection between the conductive terminal of the first circuit board such as the flexible wiring board and the conductive terminal of the second circuit board.

Preferably, in the circuit board connecting structure in accordance with the present invention, the spacing member is provided such that it is associated with at least a part of an area wherein the conductive member is disposed, and a part of the first circuit board is held between the spacing member and the conductive member. With this arrangement, the spacing member is provided such that it is associated with a position where the conductive member is disposed; hence, contact pressure can be applied directly to a position where the conductive member is brought into contact with the respective conductive terminals, leading to further improved contact reliability.

Preferably, in the circuit board connecting structure in accordance with the present invention, the spacing member is formed to be larger than the conductive member in the direction of a surface of the first circuit board. With this arrangement, the spacing member formed to be larger than the conductive member makes it possible to maximize the contact pressure of the second circuit board with respect to the conductive member, permitting higher contact reliability.

Preferably, in the connecting structure of a circuit board in accordance with the present invention, the spacing member is formed of an elastic member. With this arrangement, elastically deforming the elastic member by the structural member allows the contact pressure to be further increased by taking advantage of the elastic force, thus leading to improved contact reliability.

Preferably, in the circuit board connecting structure in accordance with the present invention, the conductive member is formed of an elastic member. With this arrangement, the conductive member elastically deforms in response to a pressure applied to the first and second circuit boards, and the elastic force increases the contact pressure of a contacted portion. The pressing force is generated by the structural member and the spacing member. Hence, the conductive member and the respective conductive terminals can be brought into closer contact, with resultant improved contact reliability.

Preferably, in the circuit board connecting structure in accordance with the present invention, the conductive member has a plurality of rows of conductive portions arranged in a direction in which the conductive terminals are arranged, and insulating portions disposed between the conductive portions. With this arrangement, the conductive member provided with the plural conductive portions formed along the arranged conductive terminals further improves the contact reliability. In this case, the conductive portions need not be in one-to-one correspondence with the conductive terminals.

According to another aspect of the present invention, there is provided an electro-optical device that includes the circuit board connecting structure set forth above. Applying the foregoing circuit board connecting structure to various connecting structures formed in the electro-optical device inhibits continuity failures in connection areas of diverse circuit boards, thereby attaining successful electrical connection in the entire electro-optical device. The connecting structures are useful in achieving lower voltage of the electro-optical device.

An electro-optical device in accordance with the present invention electrically connects a conductive terminal, which is provided on a flexible wiring board electrically connected to an electro-optical display section, and a conductive terminal provided on a circuit board so as to perform display of the electro-optical display section, the electro-optical device including:

a conductive member disposed between the flexible wiring board and the circuit board to electrically connect the respective conductive terminals;

a structural member disposed on an opposite side from a side where the circuit board is disposed, in relation to the flexible wiring board; and a spacing member disposed between the structural member and the flexible wiring board.

According to the present invention, in a structure wherein a circuit board is provided at the rear side of the electro-optical display section, it is necessary to bend the flexible wiring board for connecting the electro-optical display section and the circuit board. At this time, even if stress or the like caused by such bending remains, good electrical connection between the conductive terminal of the flexible wiring board, the conductive member, and the conductive terminal of the circuit board can be attained by making an arrangement such that the spacing member and the structural member apply pressure to the flexible wiring board so as to utilize contact pressure obtained from the application of pressure. Hence, applying the present invention to a structure, wherein it is difficult to bring a flexible wiring board and another circuit board into close contact with each other, makes it possible to achieve high contact reliability, thus solving a defective continuity problem.

Preferably, in the electro-optical device in accordance with the present invention, the structural member has a support section for supporting the electro-optical display section, and a fixing section connected to the circuit board. With this arrangement, the structural member serves as the support section for supporting the electro-optical display section and also as the fixing section so as to eliminate the need for adding a special dedicated support member or fixing member. This permits a reduced number of parts and accordingly lower cost especially in mass production of electro-optical devices.

The electro-optical device in accordance with the present invention is ideally used for a liquid crystal display (LCD) device. It is preferable in the LCD device that the structural member has a support section on which an LCD panel is rested and a fixing section connected to the circuit board, and that the support section acts also as a light guiding section. With this arrangement, using the light guiding section of the electro-optical display section also as the support section of the structural member obviates the need for adding a special dedicated member. This makes it possible to reduce the number of parts and to reduce cost especially in mass production of LCD devices. Further preferably, the structural member has a fixing section for fixing the LCD panel. This arrangement permits further reduction in the number of parts with resultant further reduction in cost.

The electro-optical device in accordance with the present invention does not limit its application only to an LCD device; it is applicable to a variety of electro-optical devices, including a thin cathode ray tube, a small television employing a liquid crystal shutter or the like, an electroluminescent display, a plasma display, a CRT display, and a field emission display (FED) panel.

According to still another aspect of the present invention, there is provided electronic apparatus that includes the electro-optical device set forth above. Applying the foregoing electro-optical devices to various structures formed in general electronic apparatus solves the problem of continuity failures in connection areas of diverse circuit boards thereby to permit successful electrical connection in the entire electronic apparatus.

According to a further aspect of the present invention, there is provided a manufacturing method for an electro-optical device wherein a conductive terminal provided on a flexible wiring board electrically connected to an electro-optical display section is electrically connected to a conductive terminal provided on a circuit board, the manufacturing method including the steps of:

disposing a structural member at a rear side of the electro-optical display section, and bending the flexible wiring board toward a rear side of the structural member to oppose the flexible wiring board to the circuit board;

disposing a conductive member in a predetermined area between the conductive terminal of the bent flexible wiring board and the conductive terminal of the circuit board;

disposing a spacing member in a predetermined area between the bent flexible wiring board and the structural member such that the spacing member is positioned to be associated with at least a part of the area wherein the conductive member is disposed; and defining an interval between the structural member and the circuit board thereby to compression-bond the conductive member to the respective conductive terminals via the spacing member so as to electrically connect the flexible wiring board and the circuit board.

The manufacturing method in accordance with the present invention permits the foregoing electro-optical devices to be efficiently formed.

Preferably, in the manufacturing method, in the step for electrically connecting the flexible wiring board and the circuit board, the structural member has a fixing section connected to the circuit board, and the interval between the structural member and the circuit board is defined by connecting the fixing section to the circuit board. This method allows the conductive member to be easily compression-bonded to the foregoing conductive terminals thereby to permit reliable electrical connection between the flexible wiring board and the circuit board.

DESCRIPTION OF THE PREFERRED EMBODIMENTS

Embodiments wherein a connecting structure of a circuit board in accordance with the present invention is applied to an LCD device, which is one example of an electro-optical device, will be described in detail with reference to the accompanying drawings.

Figure 1:
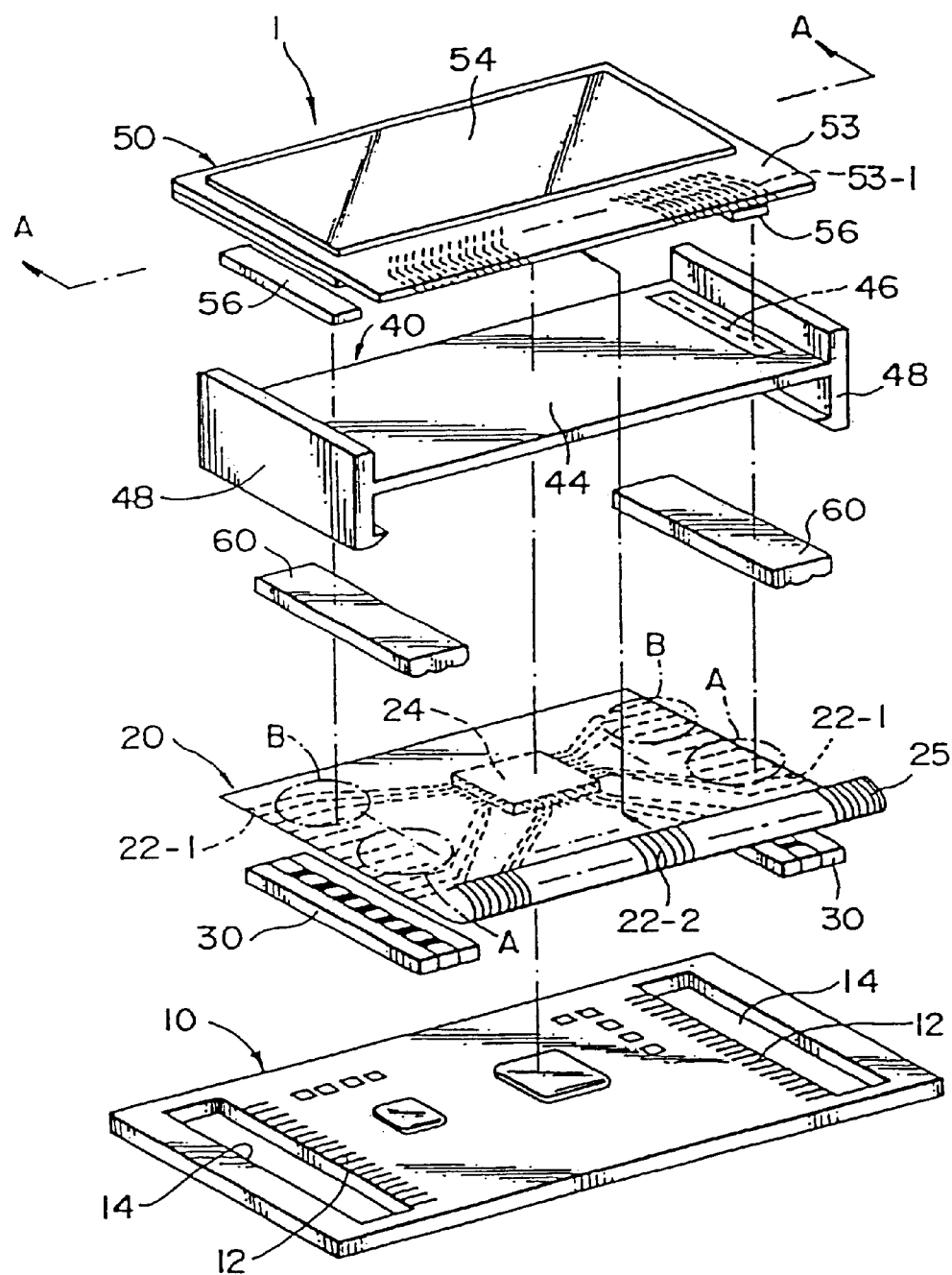
FIG. 1 is an exploded perspective view showing an embodiment of a liquid crystal display (LCD) device in accordance with the present invention.
Figure 2:
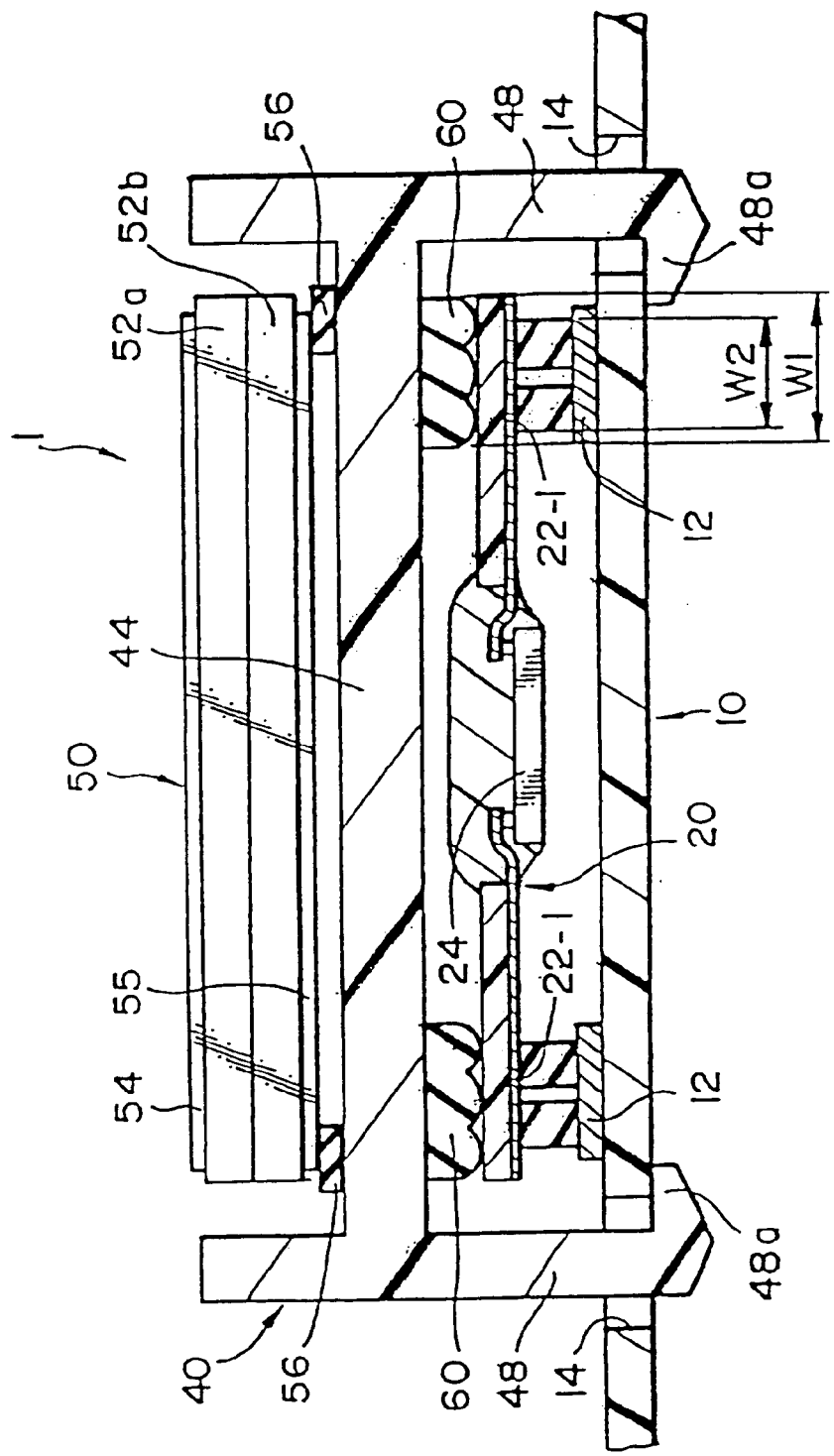
FIG. 2 is a sectional view showing the LCD device of FIG. 1.

FIG. 1 is an exploded perspective view showing an LCD device in accordance with the present invention. FIG. 2 is a fragmentary sectional view taken along the line A—A of the LCD device shown in FIG. 1.

An LCD device 1 includes, in a metal frame (not shown), a circuit board 10 serving as a second circuit board, a flexible wiring board 20 serving as a first circuit board, two conductive members 30, a structural member 40 having a light source 46 formed of an LED or the like and a light guide 44 acting as a backlight, an LCD panel 50, and spacing members 60. The two conductive members 30 and the flexible wiring board 20 are used for electrical connection between the LCD panel 50 and the circuit board 10.

Figure 3:
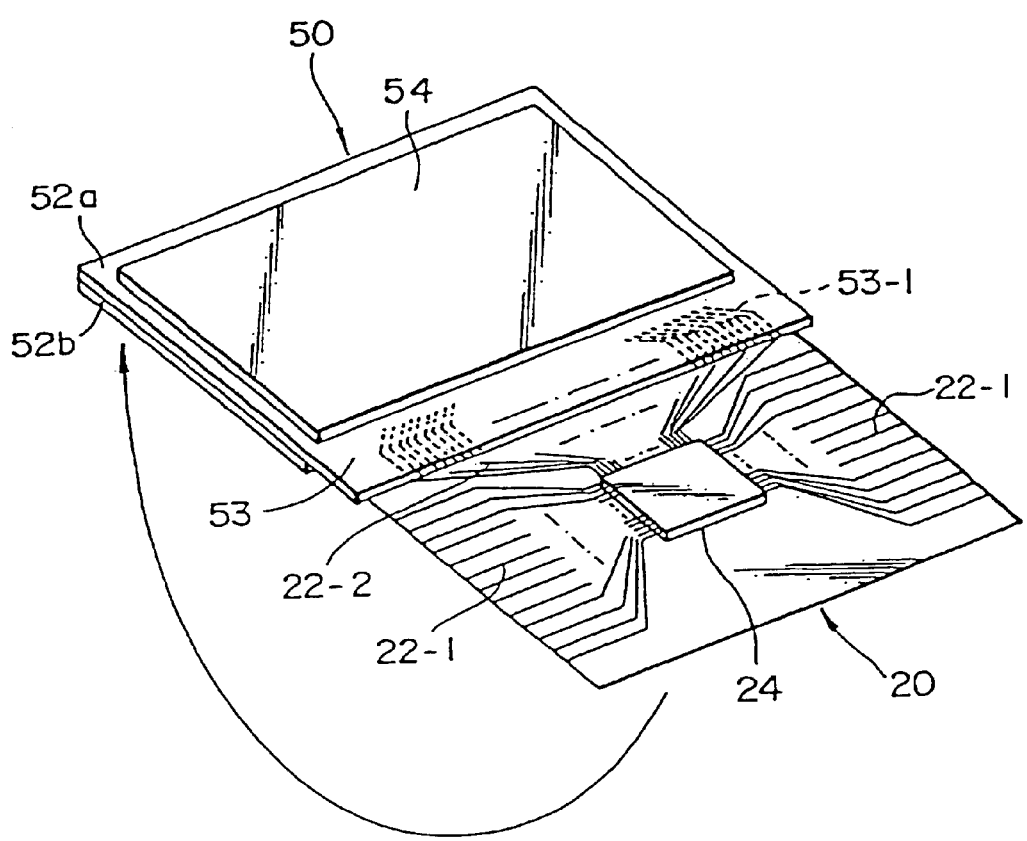
FIG. 3 is a perspective view showing a connection between a flexible wiring board and an LCD board of the LCD device of FIG. 1.

Referring now to FIG. 3, the flexible wiring board 20 is formed by connecting beforehand a conductive terminal 22-2, which is connected to the LCD panel 50, to a conductive terminal 53-1 of the LCD panel 50 so as to constitute a so-called COF type LCD device. The conductive terminal 53-1 of the LCD panel 50 is formed, for example, on an edge portion 53 of one transparent substrate 52a which constitutes the LCD panel 50 and extends beyond the other transparent substrate 52b. The conductive terminal 53-1 of the LCD panel 50 and the conductive terminal 22-2 of the flexible wiring board 20 are connected by thermal compression bonding via a bond capable of forming an anisotropic conductive film (ACF) that has metallic balls such as nickel balls or solder balls dispersed in a thermoplastic adhesive agent, or plastic provided with metal plating and dispersed elastic particles.

The flexible wiring board 20 is bent as indicated by an arrow shown in FIG. 3 when it is used. This is because the circuit board 10 on which diverse circuits making up electronic apparatus, which will be discussed hereinafter, are mounted is disposed at the rear side of the LCD panel 50 as shown in FIG. 1. Accordingly, the exploded perspective view of FIG. 1 shows a state wherein the circuit board 10 has been disposed at the rear side of the LCD panel 50 after bending the flexible wiring board 20.

Thus, the flexible wiring board 20 is bent, and the conductive terminals 22-1 provided on opposing two sides of the flexible wiring board 20 are connected to conductive terminals 12, respectively, provided on opposing two sides of the flat circuit board 10 via conductive members 30. FIG. 2 shows the conductive terminal 22-1 of the flexible wiring board 20 that has been connected to the conductive terminal 12 of the circuit board 10.

Referring to FIG. 2, the circuit board 10 disposed at the back of the LCD panel 50 is formed of, for example, a printed circuit board (PCB). A variety of circuits including a display information processing circuit, and the like related to the LCD panel 50, a power circuit and circuits for apparatus main unit are mounted on the circuit board 10. The conductive terminals 12 of the diverse circuits are therefore formed on the circuit board 10.

The flexible wiring board 20 has a predetermined pattern of wiring on the flexible board, an IC chip being mounted thereon by various methods. As the flexible wiring board 20, a tape carrier package (TCP) type, for example, is available which employs a tape formed of resin such as a polyimide and a wiring layer of a metal such as copper (Cu) integrally formed with the polyimide tape or the like, and an IC chip 24 mounted on the tape, by the gang bonding process (metal eutectic bonding process) or the like. Furthermore, as the flexible wiring board 20, another type may be used that has an IC chip mounted on a flexible board, which is equipped with a wiring layer, via an anisotropic conductive film (ACF), although it is not shown. The IC chip mounted on the flexible wiring board is preferably a driving circuit or the like for driving, for example, the LCD panel 50. As another alternative, a chip-type electronic part may be mounted via an ACF or by soldering. A conductive terminal 22-2 on the side of the LCD panel 50, and the conductive terminals 22-1 to be brought into contact with the conductive members 30, and the like constitute a part of the wiring pattern.

Thus, on the flexible wiring board 20, the conductive terminal 22-2 on the side the LCD panel 50 is connected to a terminal 53-1 provided along an edge 53 of the transparent substrate 52a constituting the LCD panel 50, and the conductive terminals 22-1 of the circuit board 10 are electrically connected via the conductive members 30 to the conductive terminals 12 provided on the circuit board 10. This allows diverse electric signals and power to be supplied to the LCD panel 50 from the conductive terminals 12 of the circuit board 10 of the apparatus main unit via the conductive members 30, the conductive terminals 22-1, the IC chip 24, and the conductive terminal 22-2.

Figure 4:
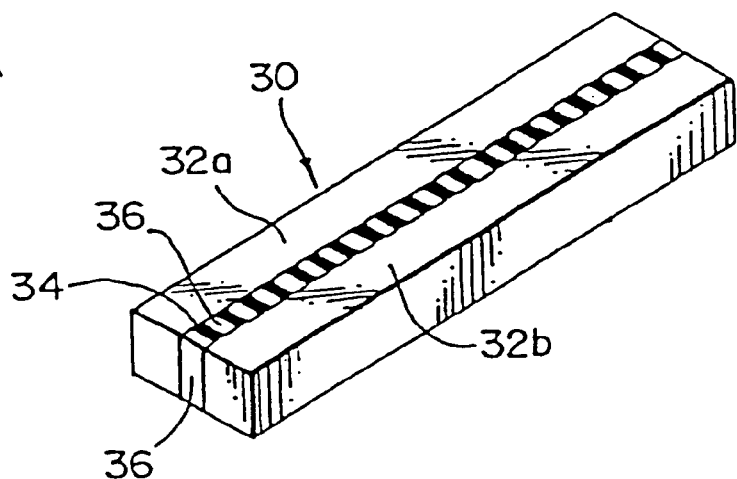
FIGS. 4A through 4C are perspective views illustrating examples of a conductive member of the LCD device of FIG. 1.
Figure 4:
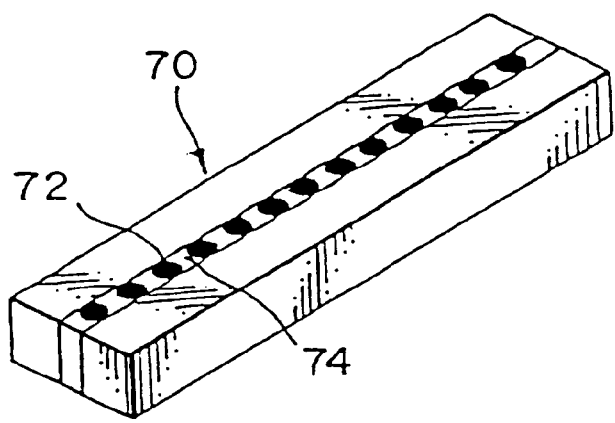
Figure 4:
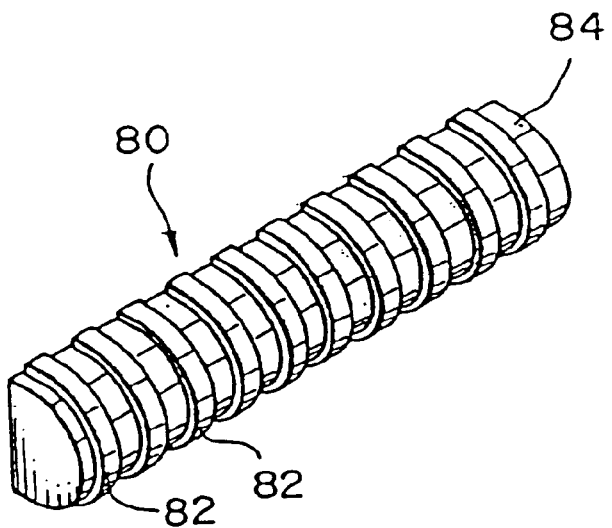

The conductive members 30 are elastic conductors composed of, for example, elastic members: They are placed between the flexible wiring board 20 and the circuit board 10 of the apparatus main unit to elastically provide electrical connection between the conductive terminals 22-1 and the conductive terminals 12. Furthermore, the conductive members 30 function as rubber connectors (RCs), each of which having a pair of side portions 32a and 32b extending lengthwise, insulating portions 36 formed between the side portions 32a and 32b, and a plurality of conductive portions 34 which are located between the side portions 32a and 32b, formed between each of the insulating portions 36 at the same time, and arranged in a direction in which the conductive terminals 22-1 are arranged as illustrated in FIG. 4A. Preferably, the intervals between the respective conductive portions 34 range from 30 μm to 50 μm.

The conductive members 30 may be formed of, for example, anisotropic conductive rubber members or the like, rubber members with conductive particles dispersed therein, rubber members with thin metal lines embedded therein, or members with conductors formed in a zebra-stripe pattern.

For example, the conductive member may be a conductive member 70 composed of an elastic insulator 74 with a plurality of metal wires 72 made of gold or the like embedded therein as shown in FIG. 4B. As another alternative, there is a conductive member 80 in which a plurality of metal wires 82 made of gold or the like are provided on the outer peripheral surface of a fixing plate 84 formed to have a nearly semicircular section as illustrated in FIG. 4C. From the viewpoint of strength, the section is preferably formed to be nearly semicircular.

As shown in FIG. 2, the structural member 40 functions as the light guide 44 that guides an incident light from the light source 46 such as an LED toward the rear of the LCD panel 50, and it also functions as a support section for supporting the LCD panel 50. Furthermore, the structural member 40 has fixing sections 48 that project downward. The fixing sections 48 of the structural member 40 are fitted through openings 14 in the circuit board 10 of the apparatus main unit to combine the structural member 40 and the circuit board 10 into one piece. Spacing members 60, the flexible wiring board 20, and the conductive members 30 are disposed in this order from the LCD panel 50 side, being held between the structural member 40 and the circuit board 10, which are made integral by means of the fixing sections 48. This makes it possible to integrally retain the circuit board 10, the conductive members 30, the flexible wiring board 20, the spacing members 60, and the like. The structural member 40 on which the LCD panel 50 is mounted can also be used as the light guide 44, so that there is no need for adding members exclusively used for fixing the members, other than the structural member 40 having the light guide 44. This permits the number of parts to be reduced and cost to be reduced accordingly especially when mass-producing LCD devices.

Referring to FIG. 2, the spacing members 60 installed between the structural member 40 and the flexible wiring board 20 are formed of elastic members, e.g., a rubber member made of silicone rubber, sponge members, tube members, or the like, or elastic members with air therein, plastic members, or the like. The spacing members 60 have plural rows of protuberances on the surfaces that are in contact with the flexible wiring board 20. The spacing members 60 are formed so that they have a thickness greater than a gap between the structural member 40 and the flexible wiring board 20. By making use of an elastic force produced by elastically deforming the spacing members 60, the contact pressure of the conductive members 30 against the flexible wiring board 20 is increased thereby improving the contact reliability. Preferably, the compression rate of the spacing members 60 ranges from 15% to 20%.

Further preferably, the conductive members 30 are also formed of elastic members. The conductive members 30 elastically deform according to the pressure applied to the flexible wiring board 20 and the circuit board 10, and a resultant elastic force increases the contact pressure of a contact portion. The pressing force is generated by the structural member 40 and the spacing members 60. Thus, the contact reliability is improved by bringing the conductive members 30 and the respective conductive terminals 12 and 22-1 into closer contact.

In the present embodiment, plural, e.g. two, spacing members 60 are provided so that they are associated with the positions where the conductive members 30 are disposed. This makes it possible to directly apply pressure to the points of the conductive members 30 that come in contact with the respective conductive terminals 12 and 22-1, thereby further improving the contact reliability.

Each of the spacing members 60 in this embodiment is formed to have width W1 so that W2<W1, where W2 denotes the width of the conductive member 30 as shown in FIG. 2. This allows the contact pressure of the flexible wiring board 20 against the conductive members 30 to be maximized, permitting further improved contact reliability.

Figure 5A:
FIGS. 5A through 5E are sectional views showing examples of a spacing member of the LCD device of FIG. 1.
Figure 5B:
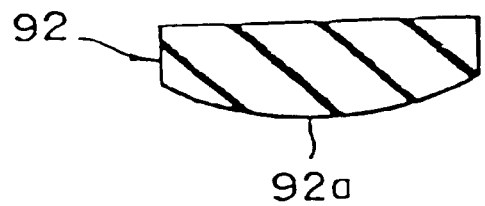
Figure 5C:
Figure 5D:
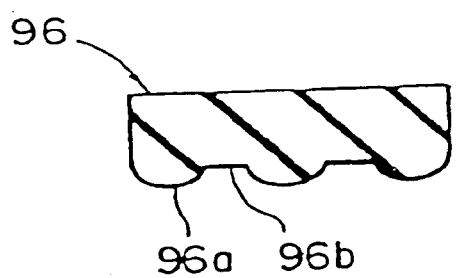
Figure 5E:
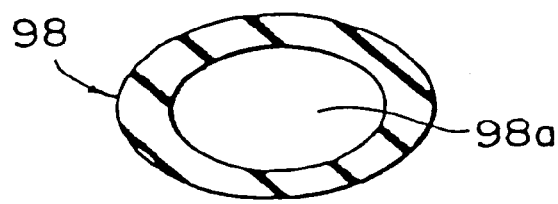

The members for the spacers are not limited to the examples mentioned above; they may be available in a variety of modifications, including a spacing member 90 having a nearly square section in cross section as shown in FIG. 5A, a spacing member 92 having a curved surface portion 92a which is a curved surface thereof to be in contact with a flexible wiring board as shown in FIG. 5B, a spacing member 94 having a nearly elliptic section in cross section as shown in FIG. 5C, a spacing member 96 having a protuberance 96a and a recess 96b on a surface thereof to be in contact with the flexible wiring board as shown in FIG. 5D, and a tube-like spacing member 98 having a hollow section 98a into which air is injected to secure an elastic force as shown in FIG. 5E.

In the present embodiment, a plurality of discrete spacing members 60 are formed in relation to the conductive terminals 22-1 as shown in FIG. 1; however, the spacing members may be formed in advance according to a circuit pattern. This type of spacing members are desirable from a viewpoint of connection reliability of the conductive members 30, since they are formed beforehand according to the circuit pattern. Alternatively, the spacing member may be formed as an integral member that covers the entire rear surface of the flexible wiring board 20.

Referring to FIG. 2, the LCD panel 50 has two transparent substrates (poly-silicon glass substrates) 52a and 52b, liquid crystal being sealed therebetween. This constitutes at least a dot-matrix type LCD panel. The LCD panel 50 has polarizers 54 and 55 on the top and bottom surfaces, respectively, thereof. Circuits that are not mounted on the LCD panel 50 or the flexible wiring board 20 are handled as external circuits of the LCD panel 50; they can be mounted on the circuit board 10. As an alternative, a driving circuit, or a display information processing circuit in addition to the driving circuit, and the like may be formed on one of the transparent substrates constituting the LCD panel.

In this example, the rear surface of the LCD panel 50 and the light guide 44 of the structural member 40 are fixed using a double-sided adhesive tape 56 or the like.

A manufacturing method for the LCD device 1 will now be described with reference to FIG. 1 through FIG. 3.

First, as shown in FIG. 3, the conductive terminal 22-2, which is located closer to the LCD panel, of the flexible wiring board 20 is electrically connected to the conductive terminal 53-1 formed on the edge portion 53 of the transparent substrate 52a of the LCD panel 50, then the LCD panel 50 and the flexible wiring board 20 are connected. Next, as shown in FIG. 1, the rear surface of the LCD panel 50 and the light guide 44 of the structural member 40 are fixed using the double-sided adhesive tape 56.

After that, the flexible wiring board 20 is bent toward the rear surface of the LCD panel 50 as indicated by the arrow in FIG. 3. As shown in FIG. 1 and FIG. 2, since the structural member 40 is disposed at the rear of the LCD panel 50, bending the flexible wiring board 20 causes the flexible wiring board 20 to be positioned under the structural member 40 and also causes the flexible wiring board 20 to face the circuit board 10. The spacing members 60 are disposed between the bent flexible wiring board 20 and the structural member 40 such that they are associated to the positions where the conductive members 30 are disposed.

On the surface of the circuit board 10 where the conductive terminals 12 are formed, the conductive members 30 are disposed between the conductive terminals 22-1 of the bent flexible wiring board 20 and the conductive terminals 12 of the circuit board 10. Under this condition, the fixing section 48 of the structural member 40 is engaged with the circuit board 10 to fix it. In this embodiment, the fixing sections 48 of the structural member 40 are inserted via the openings 14 formed in the circuit board 10, and hooking sections 48a formed at the distal ends of the fixing sections 48 are engaged with the rear surface of the circuit board 10 to secure the structural member 40 and the circuit board 10 together.

Thus, as the structural member 40 is fixed to the circuit board 10, the pressure produced by the elastic deformation of the spacing members 60 and the conductive members 30 causes the flexible wiring board 20 and the circuit board 10 to be brought into close contact. The conductive members 30 are connected to the respective conductive terminals 12 of the circuit board 10 and the respective conductive terminals 22-1 of the flexible wiring board 20 to secure continuity, thus permitting easy, reliable connection between the flexible wiring board 20 and the circuit board 10.

As set forth above, according to the first embodiment, since the conductive members and the spacing members hold the flexible wiring board therebetween, the respective members are pressed against each other as the structural member is fixed to the circuit board. As a result, firm and soft contact between the circuit board and the flexible wiring board can be maintained.

Especially when the flexible wiring board 20 is bent as described above, the areas wherein the conductive terminals 22-1 are formed tend to tilt from areas A of FIG. 1 wherein an end 25 to be bent is formed, toward areas B which are not bent due to remaining stress or the like as shown in FIG. 1. This prevents a uniform-contact surface from being obtained, and situations arise wherein, for example, the conductive terminal 22-1 and the conductive member 30 are in good contact in areas B, whereas the conductive terminal 22-1 and the conductive member 30 are in incomplete contact in areas A.

To solve the above problem, in this embodiment, the spacing members 60 are disposed to include areas A and areas B of the flexible wiring board 20 such that they are associated with the positions where the conductive members 30 are disposed thereby to secure even contact pressure in areas A and areas B. This enables highly reliable connection between the flexible wiring board and the circuit board. Furthermore, an LCD device formed by connecting the flexible wiring board and the circuit board will feature highly reliable electrical connections.

Figure 6:
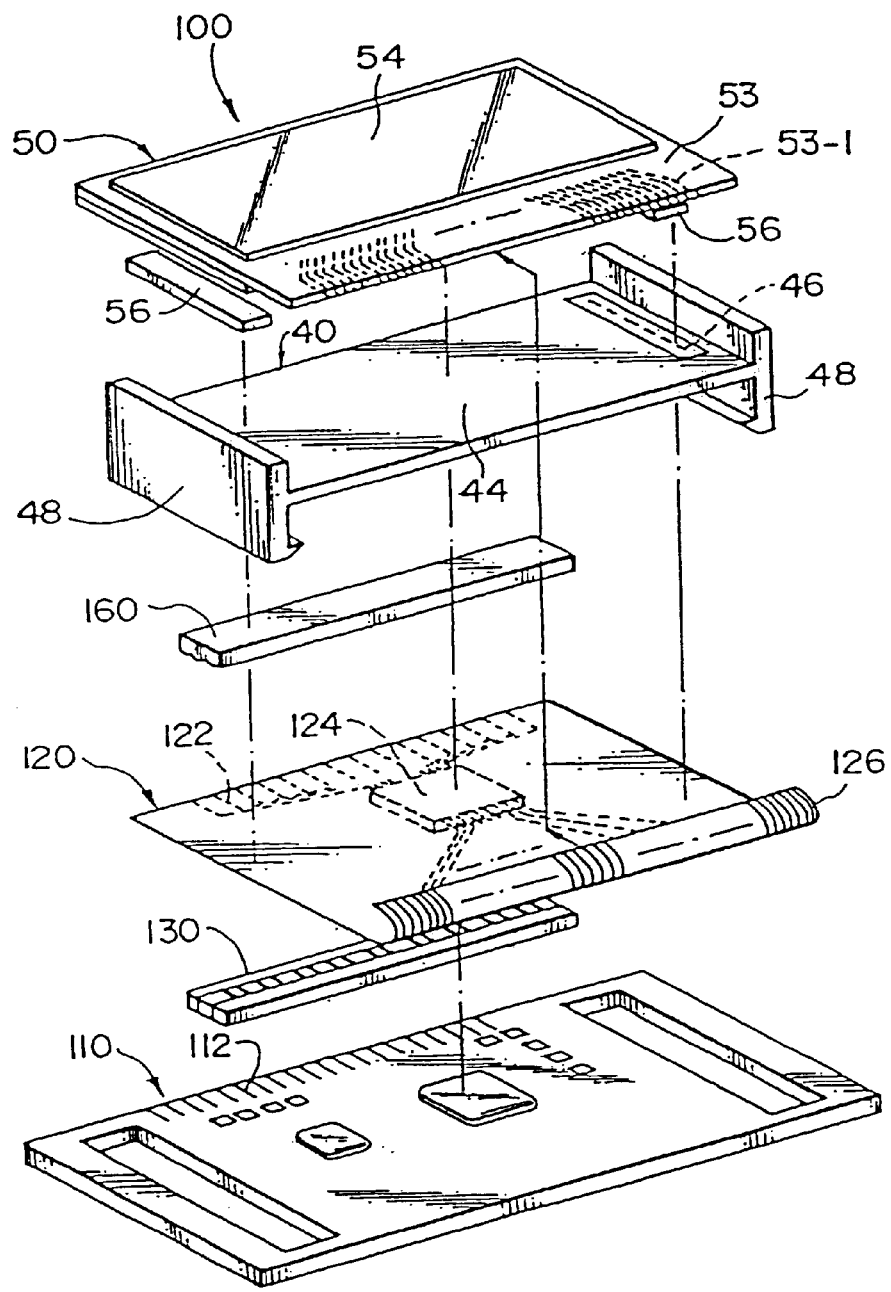
FIG. 6 is an exploded perspective view illustrating another embodiment of the LCD device in accordance with the present invention.

A second embodiment of the present invention will be described in conjunction with FIG. 6. Members having like functions as those in the first embodiment set forth above will be assigned like reference numerals, and the description thereof will not be repeated.

This embodiment shows an example wherein the circuit pattern of the flexible wiring board is different from that in the first embodiment. An LCD device 100 of FIG. 6 illustrates an example of a circuit pattern on a flexible wiring board 120 wherein a conductive terminal 122 positioned on the side of a circuit board 110 and a conductive terminal 126 positioned on the side of a LCD panel 50 are formed along the long sides of the flexible wiring board 120. Hence, according to the forming pattern of the conductive terminal 122 on the side of the circuit board 110, the positions where a spacing member 160 and a conductive member 130 are disposed, the positions of the conductive terminal 122 of the circuit board 110, and the like have been changed from those in the first embodiment. Reference numeral 124 in FIG. 6 denotes an IC chip. Thus, secure contact pressure can be obtained by disposing the spacing member 160 and the conductive member 130 according to the circuit pattern, namely, the disposing positions of the conductive terminals 122 and 126, on the flexible wiring board 120.

Figure 7:
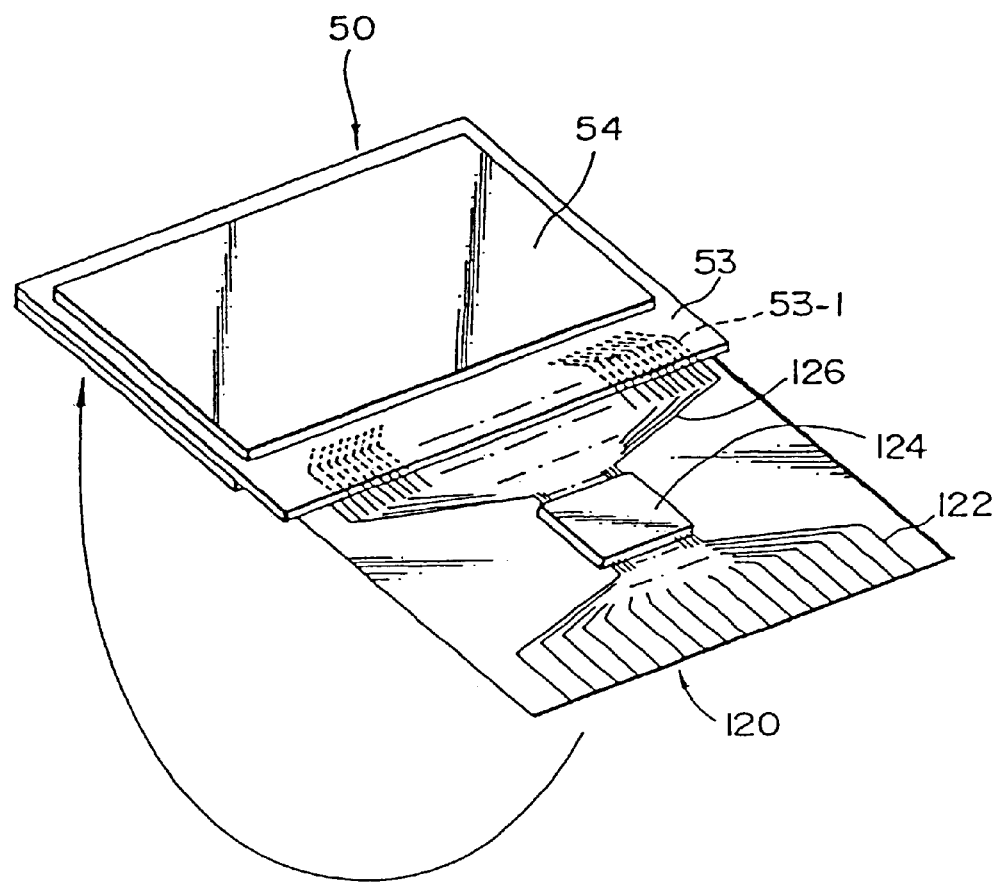
FIG. 7 is a perspective view showing a connection between a flexible wiring board and an LCD board of the LCD device of FIG. 6.

As in the first embodiment, the flexible wiring board 120 is bent as shown in FIG. 7 also in the second embodiment.

An LCD device 300 of a third embodiment in accordance with the present invention will be described with reference to FIG. 11 and FIG. 12. Members having like functions as those of the LCD device 1 of the first embodiment will be assigned like reference numerals, and the description thereof will not be repeated.

The LCD device 300 of this embodiment mainly differs from the LCD device 1 of the first embodiment in the configuration of the structural member 40. The wiring pattern of a flexible wiring board 20 is identical to that of the LCD device 100 of the second embodiment. Hence, a conductive member 30 and a spacing member 60 disposed in association with a conductive terminal 22-1 of the flexible wiring board 20 are laid out in the same manner as the LCD device 100 of the second embodiment. In FIG. 12, the conductive terminals of the flexible wiring board 20 and a circuit board 10 are not shown.

A structural member 40 of the LCD device 300 has a light guide 44, a frame section 42, and a fixing section 48.

The light guide 44 functions to guide an incident light from a light source 46, such as an LED, toward the rear of an LCD panel 50 as in the case of the LCD device 1 of the first embodiment. Furthermore, the light guide 44 acts also as a support section on which the LCD panel 50 is rested.

The frame section 42 is formed of three continuous plate members provided along three sides of the edge of the light guide 44. A plurality of hooking members 43 that project substantially horizontally toward the inner side of the frame section 42 are provided on the top edge of the frame section 42. The LCD panel 50 is inserted through an opening of the frame section 42 and installed on the top surface of the light guide 44. At this time, the hooking members 43 of the frame section 42 are engaged with the top surface of the LCD panel 50 to secure the LCD panel 50 as shown in FIG. 12. In this case, it is unnecessary to fix the LCD panel 50 to the structural member 40 by a double-sided adhesive tape 56 as in the case of the LCD device 1 of the first embodiment, so that the assembly process will be simplified.

Fixing sections 48 are formed of pin-shaped protuberances, and they project, for example, downward from the bottom surface of the light guide 44. To successfully implement the fixing and positioning function of the fixing sections 48, a plurality of, for example, four, fixing sections are provided at the four corners of the light guide 44.

The spacing member 60, the flexible wiring board 20, and the circuit board 10 are provided with holes 62, 26, 14, respectively, in which the pin-shaped fixing sections 48 are inserted. More specifically, as shown in FIG. 11, the spacing member 60 is disposed in an area wherein the conductive terminal 22-1 is formed, the area being formed along one side of the flexible wiring board 20: Hence, the spacing member 60 has two holes 62 in which the two fixing sections 48 provided on this side are inserted. Furthermore, the flexible wiring board 20 has four holes 26 and the circuit board 10 also has four holes 14, the four fixing sections 48 being inserted in the four holes of each of the two boards.

Figure 11:
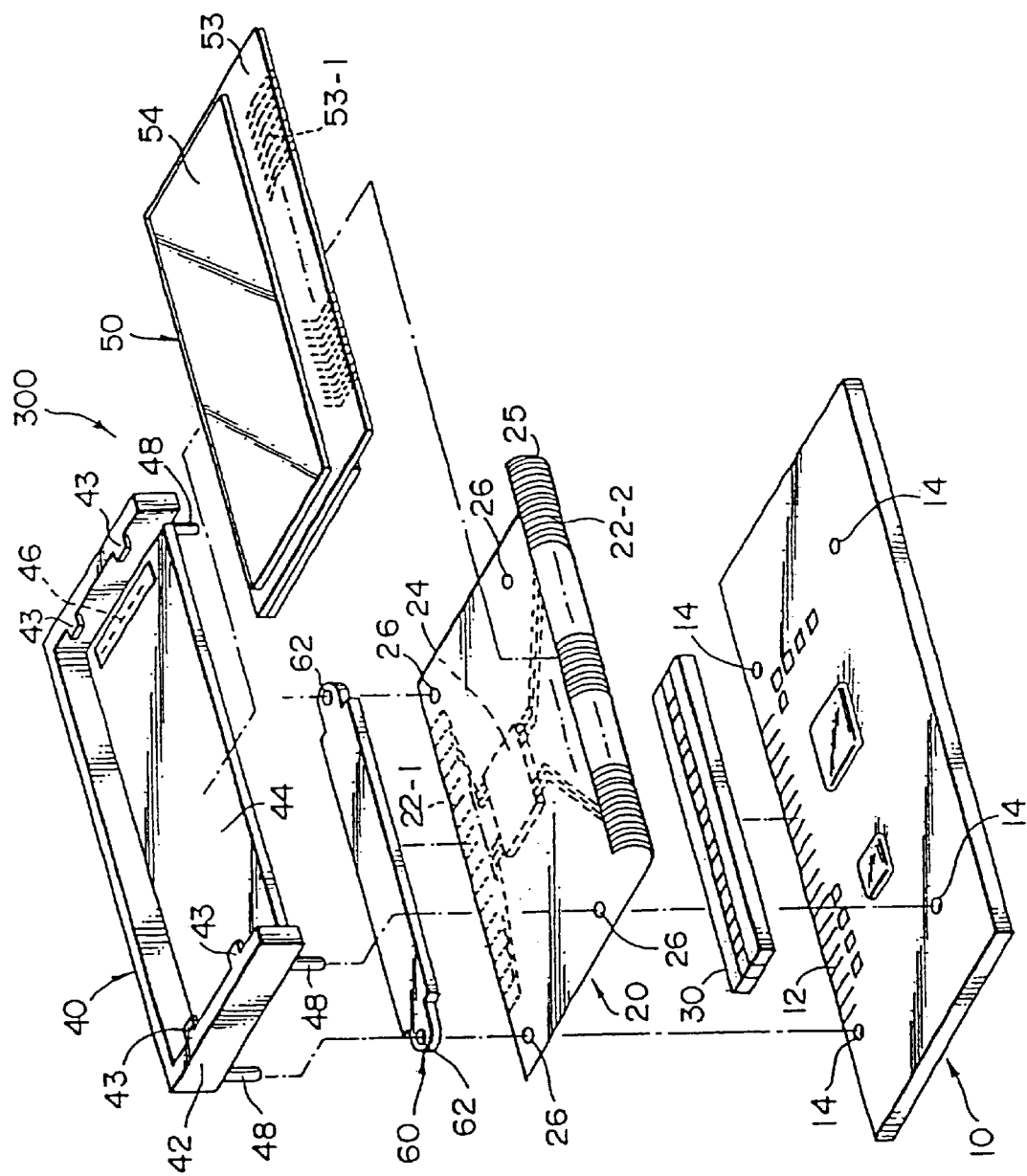
FIG. 11 is an exploded perspective view showing still another embodiment of the LCD device in accordance with the present invention.
Figure 12:
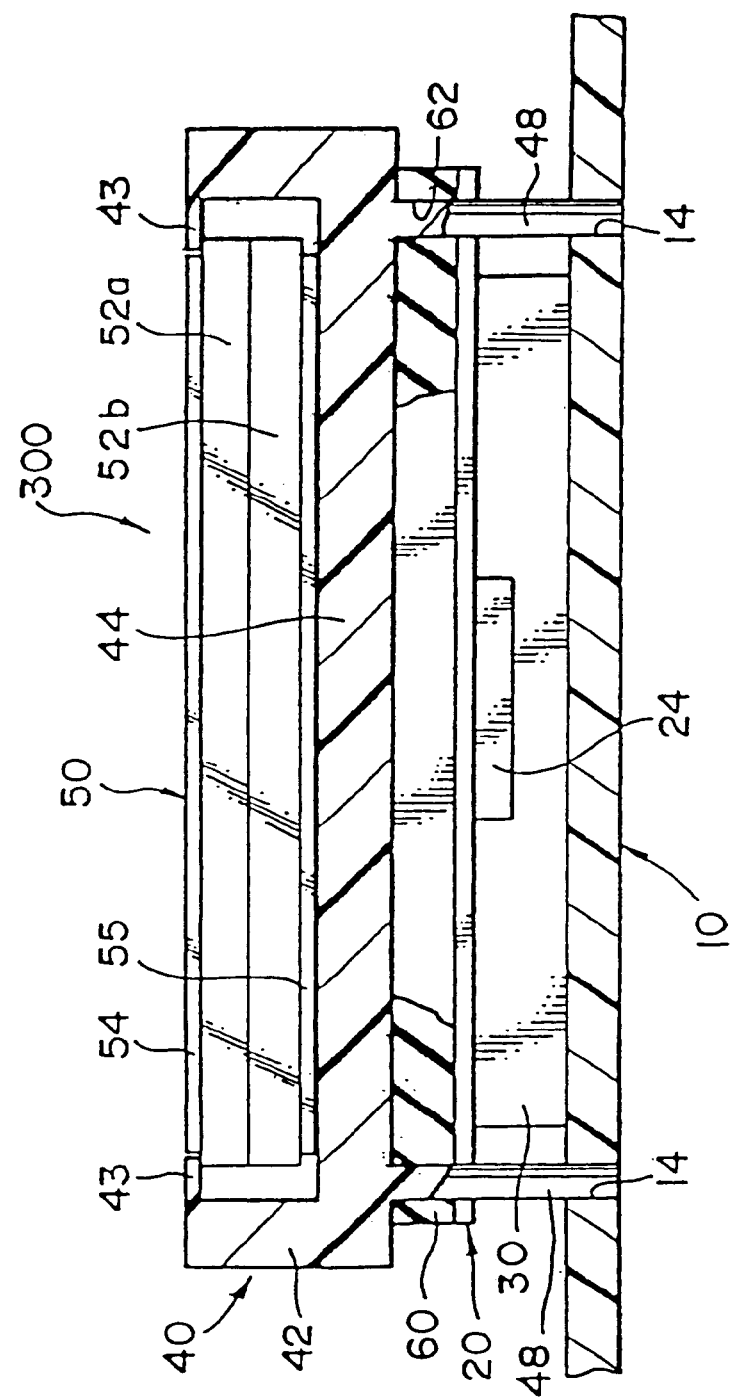
FIG. 12 is a fragmentary sectional view illustrating the LCD device of FIG. 11.

When the two fixing sections 48 are inserted in the holes 62 of the spacing member 60 and the four fixing sections 48 are inserted in the holes 26 of the flexible wiring board 20 and the holes 14 of the circuit board 10 as shown in FIG. 11, the structural member 40, the spacing member 60, the flexible wiring board 20, and the circuit board 10 are fixed in place as shown in FIG. 12. The fixing sections 48 and the circuit board 10 are fixed by, for example, press-fitting the distal ends of the fixing sections 48 into the holes 14 so that a predetermined pressure can be applied to the conductive member 30 and the spacing member 60, which are formed of elastic members, by the structural member 40 and the circuit board 10. Although it is not shown, as the means for securing the fixing sections 48 to the circuit board 10, engaging sections may be provided at distal ends as in the case of the LCD device 1 of the first embodiment.

Thus, when the structural member 40 is secured to the circuit board 10, the pressure produced by the elastic deformation of the spacing member 60 and the conductive member 30 brings the flexible wiring board 20 and the circuit board 10 into close contact with each other. The conductive member 30 is connected to the conductive terminal 12 of the circuit board 10 and the conductive terminal 22-1 of the flexible wiring board 20 to secure continuity therebetween, thus permitting easy, reliable electrical connection between the flexible wiring board 20 and the circuit board 10.

In addition, providing the hooking members 43 for fixing the LCD panel 50 to the frame section 42 of the structural member 40 enables the LCD panel 50 to be fixed simply by sliding it in. The frame section 42 positions the LCD panel 50.

As set forth above, according to the third embodiment, since the conductive member and the spacing member are disposed to hold the flexible wiring board therebetween, the members are pressed against each other as the structural member is fixed to the circuit board. As a result, firm and soft contact between the circuit board and the flexible wiring board can be maintained.

Figure 13A:
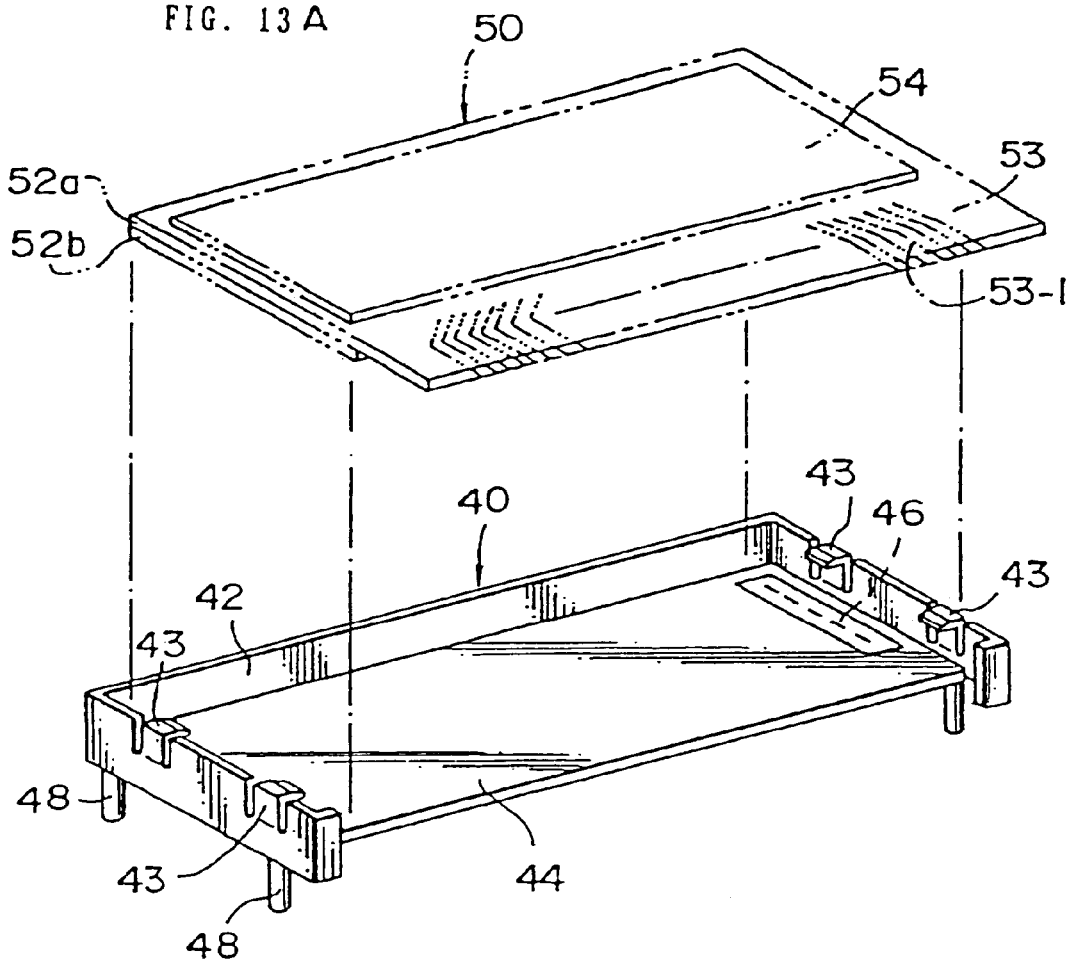
FIG. 13A is a perspective view showing a modification example of a structural member.
Figure 13B:
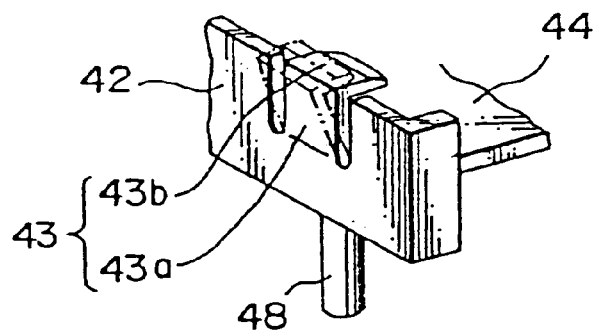
FIG. 13B is a fragmentary perspective enlarged view of a hooking section of FIG. 13A.

FIG. 13A is an exploded perspective view showing a modification example of the structural member 40. In this example, the hooking members 43 for fixing the LCD panel 50 are provide integrally with the frame section 42; they are formed such that they can be deformed outward and inward with respect to the frame section 42 by elastic deformation. Each of the hooking members 43 has a proximal section 43a that continues to a frame section 42 at its bottom end, and an engaging section 43b that is provided on the top end of the proximal section 43a and curved inward with respect to the frame section 42 as shown in an enlarged view of FIG. 13B.

To attach the LCD panel 50 to the structural member 40, the LCD panel 50 is moved downward so as to cause the hooking members 43 of the structural member 40 to elastically deform outward, thereby placing the LCD panel 50 in the frame section 42. Then, the hooking members 43 restore their original states by elastic deformation, causing the LCD panel 50 to be fixed by the engaging sections 43b. In this example, it is preferable to form the hooking members 43 into a shape that permits the LCD panel 50 to be snapped in easily with a single motion.

Figure 14:
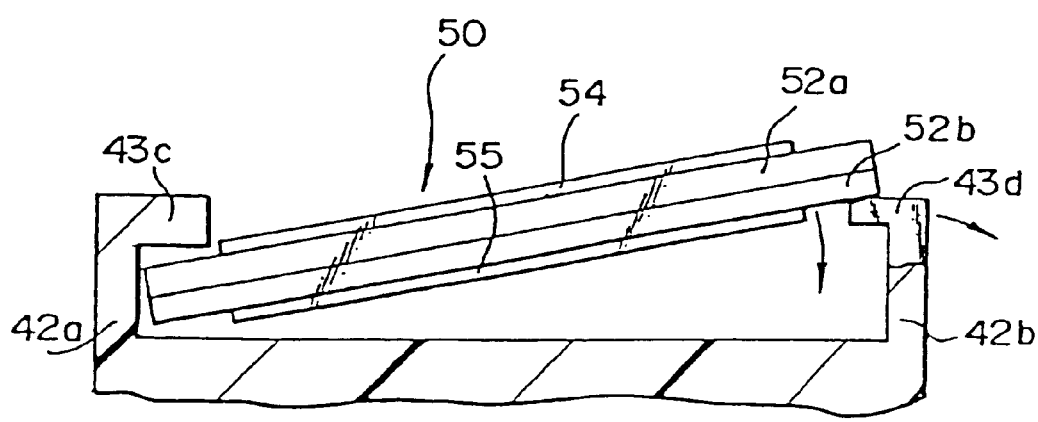
FIG. 14 is a sectional view illustrating another modification example of the structural member.

In an example shown in FIG. 14, the top end of one plate member 42a of opposing plate members of the frame section 42 is provided with a first engaging section 43c that projects inward with respect to the frame section 42. The other plate member 42b is provided with a second engaging section 43d that can be elastically deformed as in the case of the hooking members 43 described above. With the structural member 40 having the configuration, the LCD panel 50 is placed in the frame section 42 with one end of the LCD panel 50 abutted against the plate member 42a, then the other end of the LCD panel 50 is moved downward to cause the second engaging section 43d to elastically deform outward thereby to place the LCD panel 50 in the frame section 42. Then, the second engaging section 43d restores its original state due to elastic deformation, thus fixing the LCD panel 50 by the engaging section 43d.

The descriptions have been given of the hooking members and the engaging sections for fixing the LCD panel. There are no particular restrictions on the forms or dispositions of the hooking members or the engaging sections as long as they permit easy installation and fixing of an LCD panel with a single motion.

A fourth embodiment of the present invention will now be described in conjunction with FIGS. 8A and 8B. Detailed description of like components as those of the first embodiment will not be repeated.

Figure 8A:
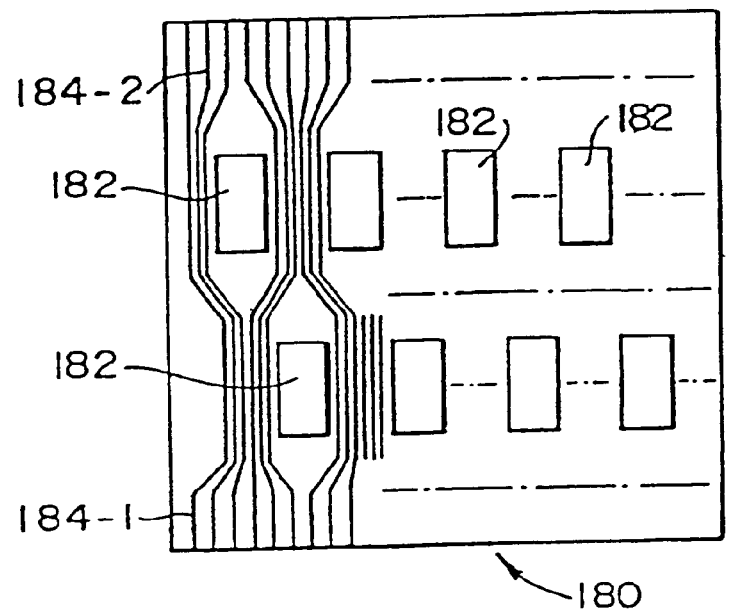
FIG. 8A is a top plan view showing another example of the flexible wiring board of the LCD device.

In a flexible wiring board 180 shown in FIG. 8A, a conductive terminal 184-2 on the side of an LCD panel is connected to a conductive terminal of the LCD panel, and a conductive terminal 184-1 on the side of a circuit board is connected to a conductive terminal of the circuit board as in the case of the flexible wiring board shown in FIG. 7.

A flexible wiring board 180 is provided with a plurality of slots 182 that are located between a connection closer to the LCD panel and a connection closer to the circuit board, and disposed widthwise. The number of the slots 182 formed per line may be any number as necessary. Likewise, the slots 182 may be formed in any number of lines.

Figure 8B:
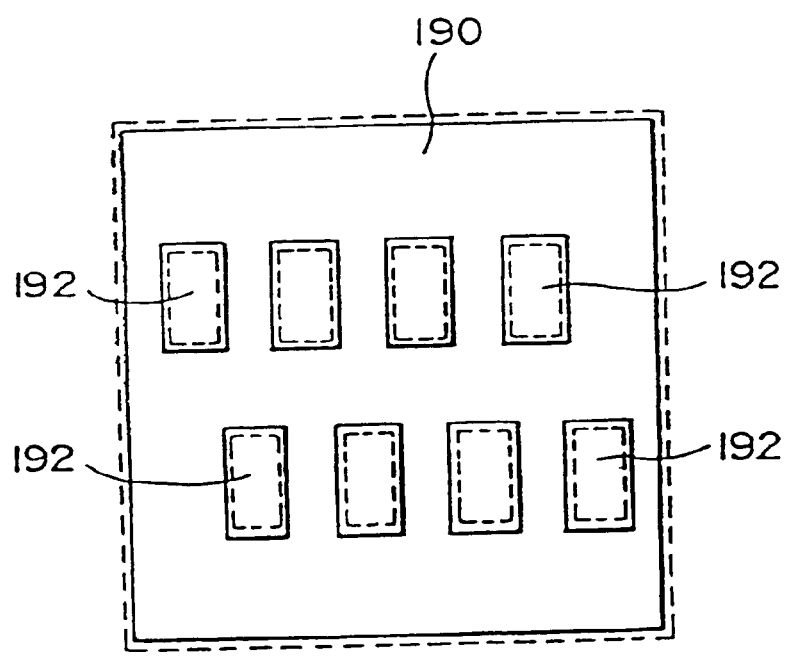
FIG. 8B is a top plan view showing an example of a spacing member provided on the flexible wiring board of FIG. 8A.

According to a circuit pattern as shown in FIG. 8A, a spacing member 190 is integrally formed to cover the entire area, excluding portions 192 wherein IC chips (not shown) are formed, as illustrated in FIG. 8B, rather than forming spacing members individually at positions associated with the conductive terminal 184-1. The spacing member 190 may be made thinner only in the portions 192 instead of excluding them as mentioned above. With this arrangement, the number of the spacing members can be reduced.

In the foregoing examples, the individual slots are rectangular; however, the slots may take any shapes, including elliptical shapes and triangular shapes, and the spacing member may be shaped accordingly.

An embodiment of electronic apparatus using the foregoing LCD device will be described with reference to FIG. 9 and FIG. 10.

Figure 9A:
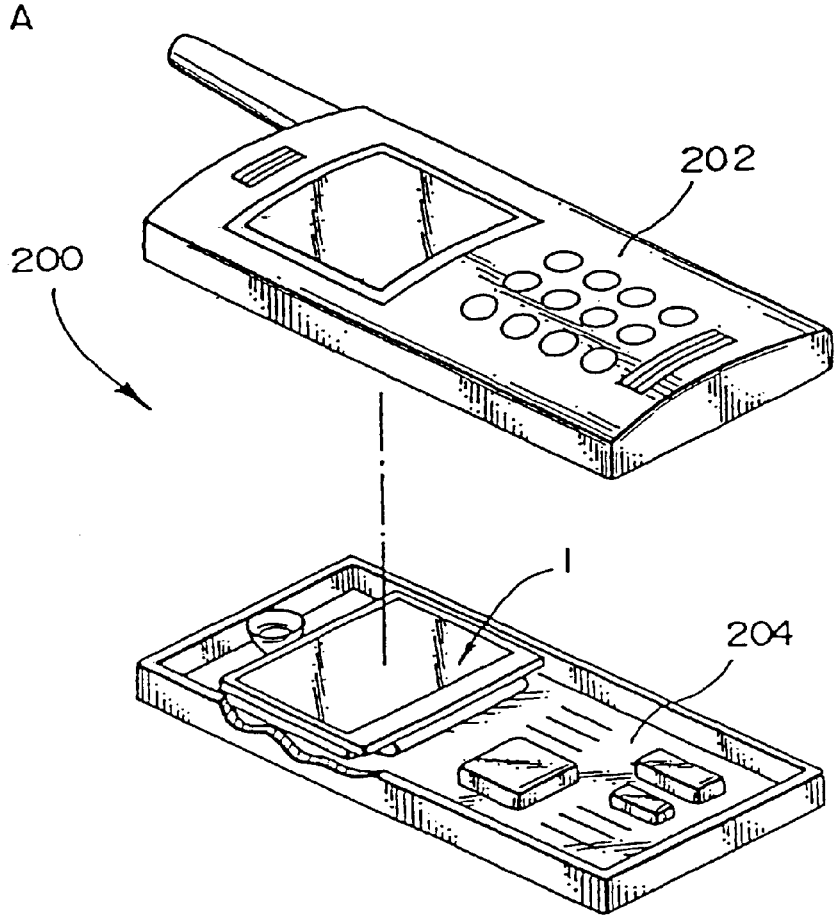
FIG. 9A is an exploded perspective view showing an embodiment of electronic apparatus in accordance with the present invention.
Figure 9B:
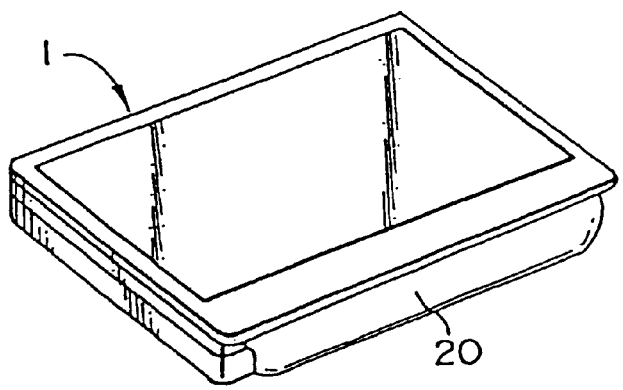
FIG. 9B is a perspective view showing an LCD device incorporated in the electronic apparatus of FIG. 9A.

FIG. 9A is an exploded perspective view showing a portable telephone 200 having an upper structural member 202 and a lower structural member 204 to which an LCD device 1 in accordance with the present invention shown in FIG. 9B has been incorporated.

As illustrated in FIG. 9B, a flexible wiring board 20 of the LCD device 1 is built into the portable telephone 200 in a bent state.

The portable telephone 200 includes more than just the LCD device 1; it includes a display information output source, a display information processing circuit, a clock generating circuit, and other diverse circuits formed on a circuit board or the like in addition to a power circuit for supplying power to these circuits.

Figure 10:
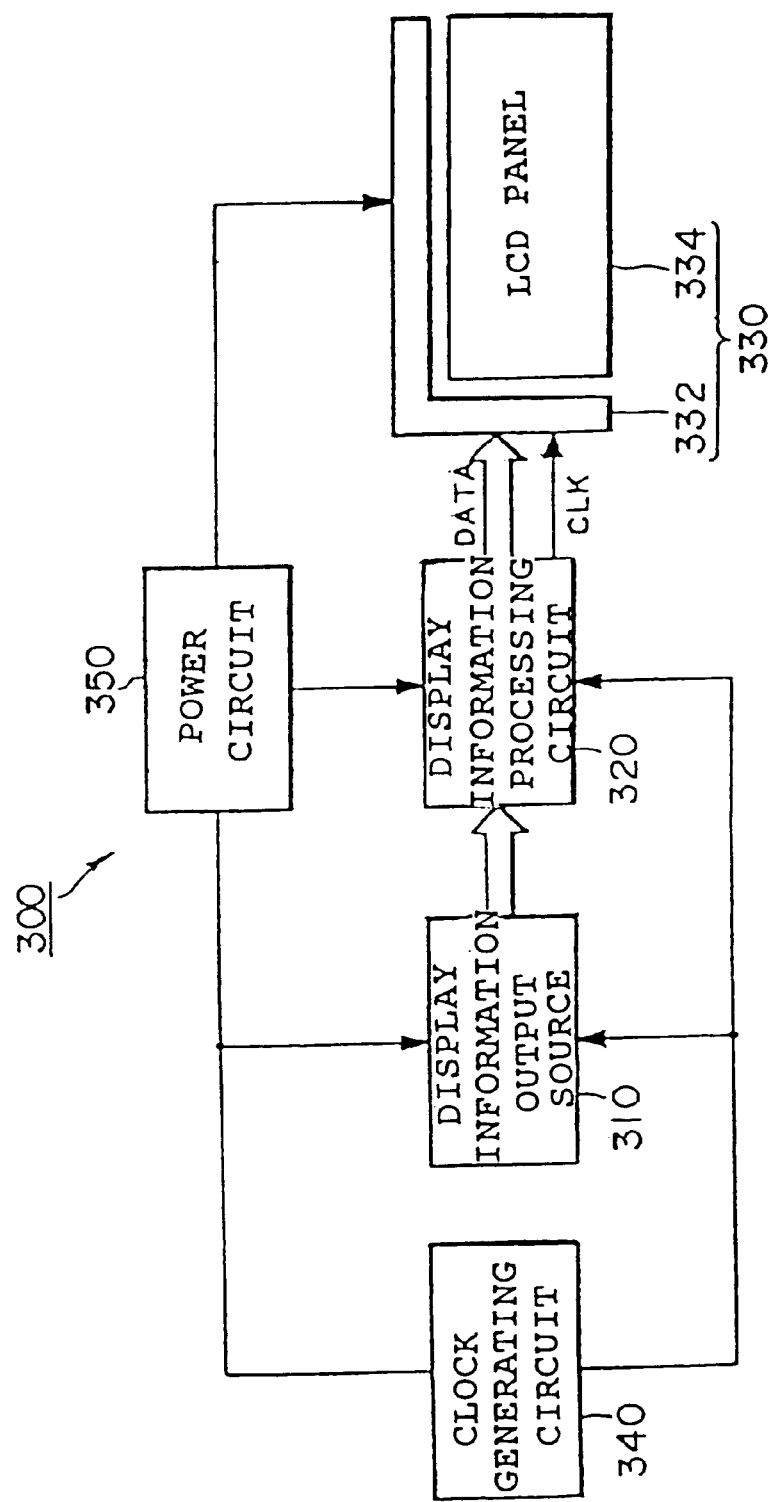
FIG. 10 is a block diagram showing an embodiment of the electronic apparatus in accordance with the present invention.

Electronic apparatus 300 constituted by employing the LCD device in accordance with the present invention includes a display information output source 310, a display information processing circuit 320, a display driving circuit 332, a display panel 330 such as a LCD panel 334, a clock generating circuit 340, and a power circuit 350 as shown in FIG. 10. The display information output source 310 is formed of memories such as a ROM and a RAM, and a tuning circuit that is tuned to television signals and outputs the signals. Based on clocks from the clock generating circuit 340, the display information output source 310 outputs video signals and other types of display information. The display information processing circuit 320 processes and outputs display information in response to the clocks from the clock generating circuit 340. The display information processing circuit 320 may include, for example, an amplifier, a polarity inverting circuit, a phase expansion circuit, a rotation circuit, a gamma control circuit, a clamp circuit, and the like. The display driving circuit 332 is constituted by a scanning driving circuit and a data driving circuit to drive the LCD panel 334 to perform display. The power circuit 350 supplies power to the respective circuits mentioned above.

Electronic apparatus in which the LCD device in accordance with the present invention is installed is not limited to the portable telephone 200; it may be a liquid crystal projector, a multimedia-compatible personal computer (PC) or engineering workstation (EWS), a pager, a word processor, a television, a viewfinder type or a monitor direct-view type video tape recorder, an electronic pocketbook, an electronic calculator, a car navigation system, a POS terminal, a device equipped with a touch panel, a timepiece, an IC card, or a mini-disc player.

In terms of a driving system, the LCD panel may be of a passive matrix LCD panel or a static drive LCD panel that does not employ switching elements for the panel itself, or an active matrix LCD panel employing a three-terminal switching element represented by a TFT or a two-terminal switching element represented by an MIM. In terms of an electro-optical characteristic, various types of LCD panels may be used, including a TN type, an STN type, a guest-host type, a phase-transition type, and a ferroelectricity type.

In the embodiments set forth above, the examples have been shown wherein the LCD panels and the circuit boards, on which driving circuits, and the like are mounted, make up the LCD devices. If, however, a driving circuit, and the like are also mounted on a transparent substrate constituting an LCD panel, then other circuits will be formed on a circuit board and a flexible wiring board.

The devices and methods in accordance with the present invention have been described by referring to several specific embodiments; however, the present invention can be implemented in various other modifications within the scope of the spirit thereof. For instance, in the embodiments, the descriptions have been given of a case wherein an LCD display is used as a video display device (electro-optical display unit); the present invention, however, is not limited thereto. A variety of other electro-optical devices may be employed, including a thin cathode ray tube, a small television employing a liquid crystal shutter or the like, an electroluminescent display, a plasma display, a CRT display, and a field emission display (FED) panel.

Furthermore, the embodiments have shown the examples wherein the flexible wiring boards are used to connect the LCD panels and the circuit boards. Obviously, however, the present invention can also be used for connecting other types of display panels such as plasma display panels, and circuit boards. Moreover, the present invention can also be applied for interconnecting various other types of circuit boards, in addition to the connection with the flexible wiring boards.

What is claimed is:

1. A circuit board connecting structure for electrically connecting a conductor terminal provided on a first circuit board and a conductive terminal provided on a second circuit board, comprising;

a conductive member disposed between said first circuit board and said second circuit board, and electrically connecting said respective conductive terminals;

a structural member disposed on an opposite side of said first circuit board from said second circuit board; and a discrete spacing member disposed between said structural member and said first circuit board, wherein said discrete spacing member and said structural member provide a predetermined contact pressure between said respective conductive terminals and said conductive member.

2. A circuit board connecting structure according to claim 1, wherein said spacing member is provided at least at a part of an area wherein said conductive member is disposed, and a part of said first circuit board is held between said spacing member and said conductive member.

3. A circuit board connecting structure according to claim 1, wherein said spacing member is formed to be larger than said conductive member in a direction of a surface of said first circuit board.

4. A circuit board connecting structure according to claim 1, wherein said spacing member is formed of an elastic member.

5. A circuit board connecting structure according to claim 1, wherein said conductive member is formed of an elastic member.

6. A circuit board connecting structure according to claim 1, wherein said conductive member has a plurality of rows of conductive portions arranged in a direction in which said conductive terminals are arranged, and an insulating portion disposed between said conductive portions.

7. A circuit board connecting structure according to claim 1, wherein said structural member has at least a support section that continues in a direction of a surface of said first circuit board, said supporting section supporting an electro-optical display section.

8. A circuit board connecting structure according to claim 1, wherein said structural member has a fixing section connected to said circuit board.

9. A circuit board connecting structure according to claim 1, wherein said first circuit board is a flexible wiring board.

10. An electro-optical device comprising the circuit board connecting structure described in claim 1.

11. An electro-optical device for electrically connecting a conductive terminal, which is provided on a flexible wiring board electrically connected to an electro-optical display section, and a conductive terminal provided on a circuit board so as to perform display of said electro-optical display section, said electro-optical device comprising:

a conductive member disposed between said flexible wiring board and said circuit board to electrically connect said respective conductive terminals;

a structural member disposed on an opposite side of said flexible wiring board as said circuit board; and a discrete spacing member disposed between said structural member and said flexible wiring board, wherein said discrete spacing member and said structural member provide a predetermined contact pressure between said respective conductive terminals and said conductive member.

12. An electro-optical device according to claim 11, wherein said structural member has a support section on which said electro-optical display section is rested, and a fixing section connected to said circuit board.

13. An electro-optical device according to claim 12, wherein said electro-optical display section is a liquid crystal display panel, and said support section is a light guide.

14. An electro-optical device according to claim 12, wherein said structural member has a fixing section for fixing said electro-optical display section rested on said support section.

15. An electro-optical device according to claim 11, wherein said spacing member is provided such that it is associated with at least a part of an area wherein said conductive member is disposed, and a part of said flexible wiring board is held between said spacing member and said conductive member.

16. An electro-optical device according to claim 11, wherein said spacing member is formed to be larger than said conductive member in a direction of a surface of said flexible wiring board.

17. An electro-optical device according to claim 11, wherein said spacing member is formed of an elastic member.

18. An electro-optical device according to claim 11, wherein said conductive member is formed of an elastic member.

19. An electro-optical device according to claim 11, wherein said conductive member has a plurality of rows of conductive portions arranged in a direction in which said conductive terminals are arranged, and an insulating portion disposed between said conductive portions.

20. Electronic apparatus comprising the electro-optical device described in claim 11.

21. An electro-optical device for electrically connecting a conductive terminal, which is provided on a flexible wiring board electrically connected to a liquid crystal display panel, and a conductive terminal provided on a circuit board so as to perform display of said liquid crystal display panel, said electro-optical device comprising:

a conductive member disposed between said flexible wiring board and said circuit board to electrically connect said respective conductive terminals;

a light guiding member disposed on an opposite side of said flexible wiring board as said circuit board; and a discrete spacing member disposed between said light guiding member and said flexible wiring board, wherein said discrete spacing member and said light guiding member provide a predetermined contact pressure between said respective conductive terminals and said conductive member.

22. An electro-optical device according to claim 21, wherein said light guiding member has a support section on which said liquid crystal display panel is rested, and a fixing section connected to said circuit board, said support section serving also as a light guide.

23. An electro-optical device according to claim 21, wherein said light guiding member has a fixing section for fixing said liquid crystal display panel.

24. An electro-optical device according to claim 21, wherein said spacing member is provided such that it is associated with at least a part of an area wherein said conductive member is disposed, and a part of said flexible wiring board is held between said spacing member and said conductive member.

25. An electro-optical device according to claim 21, wherein said spacing member is formed to be larger than said conductive member in a direction of a surface of said flexible wiring board.

26. An electro-optical device according to claim 21, wherein said spacing member is formed of an elastic member.

27. An electro-optical device according to claim 21, wherein said conductive member is formed of an elastic member.

28. An electro-optical device according to claim 21, wherein said conductive member has a plurality of rows of conductive portions arranged in a direction in which said conductive terminals are arranged, and an insulating portion disposed between said conductive portions.

29. Electronic apparatus comprising the electro-optical device described in claim 21.

30. A circuit board connecting structure for electrically connecting a conductor terminal provided on a first circuit board and a conductive terminal provided on a second circuit board, comprising:

- an electro-optic display section electrically connected to said first circuit board;
- a conductive member disposed between said first circuit board and said second circuit board, and electrically connecting said respective conductive terminals;
- a structural member disposed on an opposite side of said first circuit board from said second circuit board; and
- a discrete spacing member disposed between said structural member and said first circuit board,
- wherein said discrete spacing member and said structural member provide a predetermined contact pressure between said respective conductive terminals and said conductive member.

31. An electro-optical device for electrically connecting a conductive terminal, which is provided on a flexible wiring board, and a conductive terminal provided on a circuit board comprising:

- an electro-optical display section electrically connected to said flexible wiring board;
- a conductive member disposed between said flexible wiring board and said circuit board to electrically connect said respective conductive terminals;
- a structural member disposed on an opposite side of said flexible wiring board as said circuit board; and
- a discrete spacing member disposed between said structural member and said flexible wiring board,
- wherein said discrete spacing member and said structural member provide a predetermined contact pressure between said respective conductive terminals and said conductive member.

32. An electro-optical device for electrically connecting a conductive terminal, which is provided on a flexible wiring board, and a conductive terminal provided on a circuit board, comprising:

- a liquid crystal display panel electrically connected to said flexible wiring board;
- a conductive member disposed between said flexible wiring board and said circuit board to electrically connect said respective conductive terminals;
- a light guiding member disposed on an opposite side of said flexible wiring board as said circuit board; and
- a discrete spacing member disposed between said light guiding member and said flexible wiring board,
- wherein said discrete spacing member and said light guiding member provide a predetermined contact pressure between said respective conductive terminals and said conductive member.

33. A circuit board connecting structure comprising;

- a first conductor terminal provided on a flexible wiring board;
- a second conductor terminal provided on a circuit board, said circuit board having at least one hole formed thereon;
- a conductive member disposed between said flexible wiring board and said circuit board to electrically connect said respective conductive terminals;
- a panel support member disposed on an opposite side of said flexible wiring board as said circuit board and supporting an electro-optical display section, said panel support member having at least one latching section; and
- spacing member disposed between said panel support member and said flexible wiring board,
- wherein at least one of said latching sections engages at least one of said holes such that said panel support member and said circuit board fix the flexible wiring board between said spacing member and said conductive member.

* * * * *

UNITED STATES PATENT AND TRADEMARK OFFICE
CERTIFICATE OF CORRECTION

Page 1 of 1

PATENT NO. : 6,191,838 B1
DATED : February 20, 2001
INVENTOR(S) : Eiji Muramatsu It is certified that error appears in the above-identified patent and that said Letters Patent is hereby corrected as shown below:

Column 7,
Line 20, after "side" insert -- of --.

Column 11,
Line 51, "20:" should be -- 20. --.

Column 12,
Line 33, "provide" should be -- provided --.

Column 14,
Line 62, "comprising;" should be -- comprising: --.

Column 17,
Line 9, "electro-optic" should be -- electro-optical --.

Column 18,
Line 18, "comprising;" should be -- comprising: --.

Signed and Sealed this

Eleventh Day of September, 2001

Attest:

Attesting Officer

NICHOLAS P. GODICI
*Acting Director of the United States Patent and Trademark Office*